United States Patent
Zhao

(10) Patent No.: US 9,229,475 B2
(45) Date of Patent: Jan. 5, 2016

(54) ELECTRONIC DEVICE WITH EJECTION MECHANISM

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Jiang Zhao, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 122 days.

(21) Appl. No.: 13/965,224

(22) Filed: Aug. 13, 2013

(65) Prior Publication Data

US 2014/0146458 A1 May 29, 2014

(30) Foreign Application Priority Data

Nov. 26, 2012 (CN) .......................... 2012 1 04855419

(51) Int. Cl.
*G06F 1/16* (2006.01)
*H05K 5/00* (2006.01)
*H05K 7/00* (2006.01)
*H04M 1/00* (2006.01)
G06F 3/02 (2006.01)
H04N 5/64 (2006.01)
H05K 5/02 (2006.01)
H05K 7/16 (2006.01)

(52) U.S. Cl.
CPC ................ *G06F 1/1616* (2013.01); *G06F 1/16* (2013.01); *G06F 1/1613* (2013.01); *G06F 1/1632* (2013.01); *G06F 1/1654* (2013.01); *G06F 3/02* (2013.01); *H04N 5/64* (2013.01); *H05K 5/02* (2013.01); *H05K 7/00* (2013.01); *H05K 7/16* (2013.01)

(58) Field of Classification Search
CPC ....... G06F 1/16; G06F 1/1613; G06F 1/1616; G06F 1/1632; G06F 1/1654; G06F 3/02; H04N 5/64; H05K 5/02; H05K 7/00; H05K 7/16
USPC ............. 361/679.07, 679.21, 679.27, 679.29, 361/679.41; 455/575.3; 312/223.1, 223.2
See application file for complete search history.

(56) References Cited

U.S. PATENT DOCUMENTS

2008/0309098 A1* 12/2008 Hsu et al. .................... 292/251.5
2009/0167691 A1* 7/2009 Wang et al. ................... 345/168
2010/0289972 A1* 11/2010 Fu ................................. 348/836
2012/0194994 A1* 8/2012 Lloyd ....................... 361/679.41

* cited by examiner

*Primary Examiner* — Courtney Smith
*Assistant Examiner* — Zhengfu Feng
(74) *Attorney, Agent, or Firm* — Novak Druce Connolly Bove + Quigg LLP

(57) ABSTRACT

An electronic device includes a base, a display, and a user-actable ejection mechanism. The base defines a recessed portion. The display is received in the recessed portion, and is pivotably connected to sidewalls of the recessed portion. The user-actuatable ejection mechanism is positioned in the base, and drives the display to rotate up relative to the base when actuated by a user.

12 Claims, 10 Drawing Sheets

ELECTRONIC DEVICE WITH EJECTION MECHANISM

BACKGROUND

1. Technical Field

The present disclosure relates to electronic devices, and particularly to an electronic device with an ejection mechanism for ejecting a display of the electronic device up to an inclined position.

2. Description of Related Art

Many electronic devices such as tablet computers do not come equipped with their own means to support the electronic device at different inclined angles. If a user wants to place the electronic device at a desired inclined angle, it is necessary to use an external mechanism or means. However, it is inconvenient for the user to always carry the external mechanism or means.

Therefore, what is needed is an electronic device with means to overcome the described limitations.

DETAILED DESCRIPTION

Figure 1:
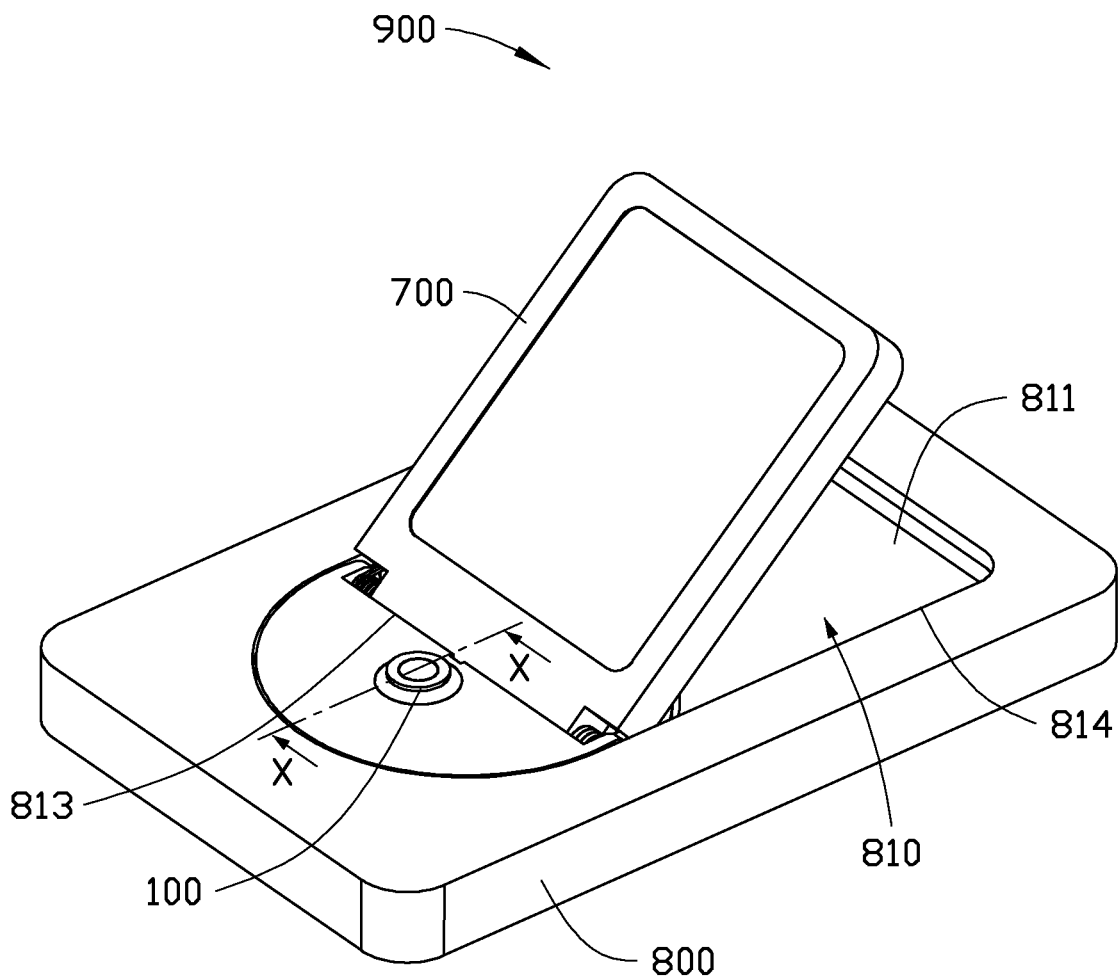
FIG. 1 is an isometric view of an electronic device with a rotatable ejection mechanism in accordance with an exemplary embodiment, showing the electronic device in a second state.
Figure 2:
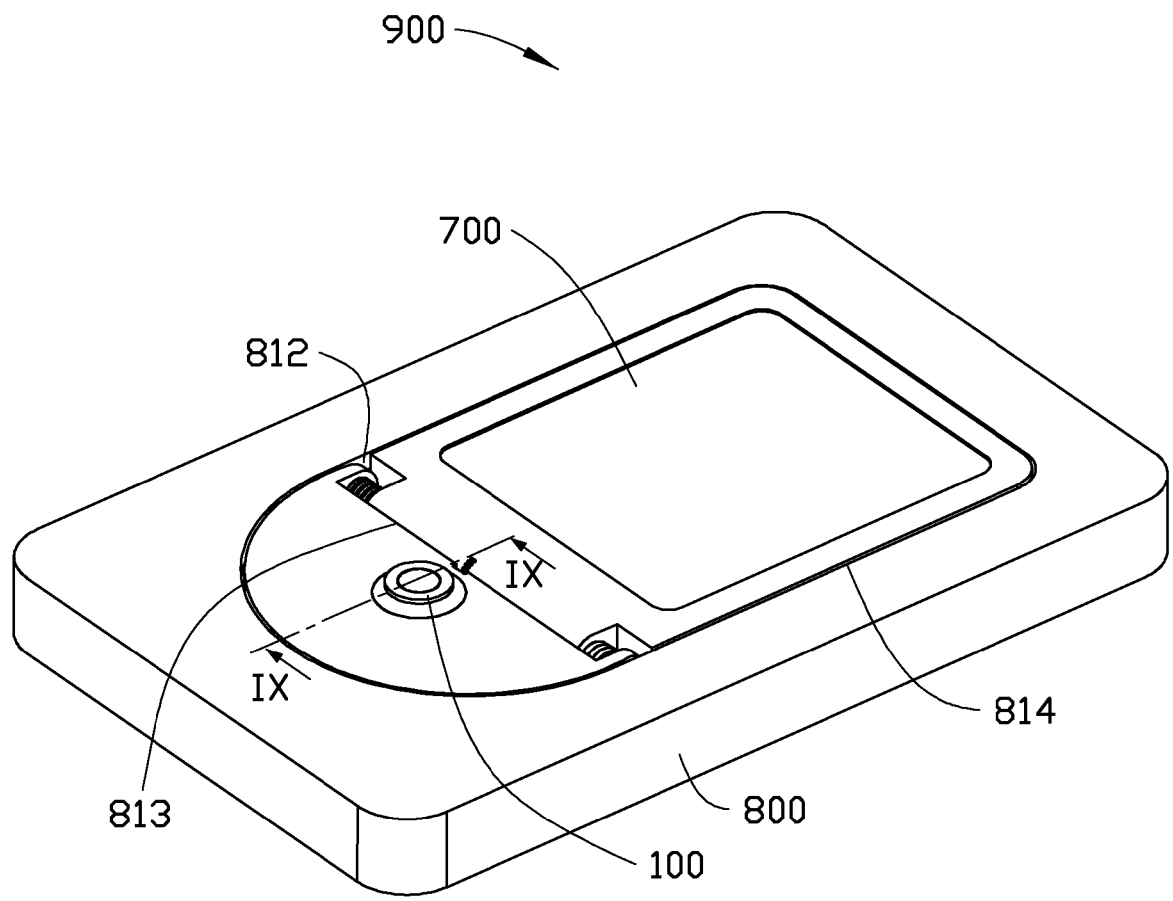
FIG. 2 is a view of the electronic device of FIG. 1 in a first state.

Referring to FIGS. 1-2, an electronic device 900 includes a display 700, a base 800, and a rotatable ejection mechanism 100. The base 800 defines a recessed portion 810. The display 700 is pivotably connected to opposite first and third sidewalls 812, 814 of the recessed portion 810, and a bottom end of the display 700 is arc-shaped. The ejection mechanism 100 is placed within the base 800, and is used to support the display 700 at an inclined angle relative to the base 800 when needed, thereby providing switching of the display 700 between a first state (FIG. 2) and a second state (FIG. 1). In the first state, the display 700 is received in the recessed portion 810. In the second state, the display 700 is positioned at an inclined angle relative to the base 800. A bottom end of the display 700 forms a number of teeth 190 (shown in FIGS. 9 and 10).

Figure 3:
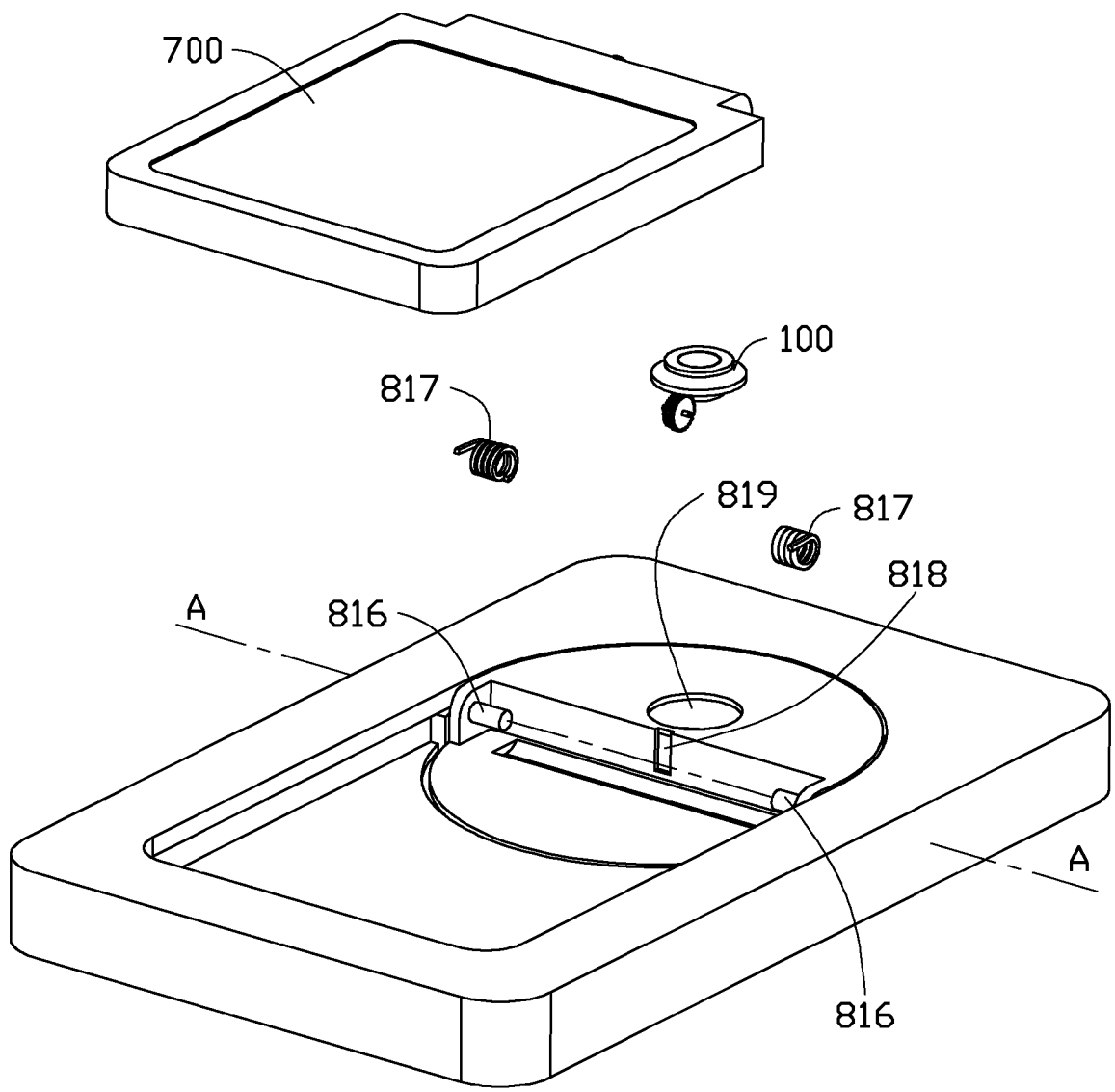
FIG. 3 is an exploded, isometric view of the electronic device of FIG. 1.

The recessed portion 810 includes a bottom 811, the first sidewall 812, a second sidewall 813, and the third sidewall 814 opposite to the first sidewall 812. Referring also to FIG. 3, the display 700 is pivotably connected to the first sidewall 812 and the third sidewall 814 by two pivot shafts 816. The two pivot shafts 816 are respectively fixed to the first sidewall 812 and the third sidewall 814. Two first torsion springs 817 are respectively placed over the two pivot shafts 816. One end of each first torsion spring 817 abuts the bottom 811, and another end of each first torsion spring 817 abuts the display 700. When the display 700 is in the first state received in the recessed portion 810, the first torsion springs 817 are twisted and store elastic potential energy. In this embodiment, when the display 700 is in the first state, the force of gravity acting on the display 700 is greater than the force corresponding to the elastic potential energy of the first torsion springs 817, and therefore the display 700 resists the first torsion springs 817 and stays in position in the recessed portion 810. When the display 700 is free to pivot up to the inclined angle relative to the base 800, the potential energy in the first torsion springs 817 is released to cooperate with the ejection mechanism 100 to position the display 700 at the inclined angle relative to the base 800. The second sidewall 813 defines a first through hole 818. Part of the ejection mechanism 100 extends through the first through hole 818 to engage with the display 700 and allow switching of the display 700 between the first state and the second state. A top surface of the base 800 defines a first opening 819 (shown in FIG. 3) for exposing another part of the ejection mechanism 100. The bottom 811 defines a receiving groove 815 (shown in FIGS. 9 and 10) for receiving some of the teeth 190.

Figure 7:
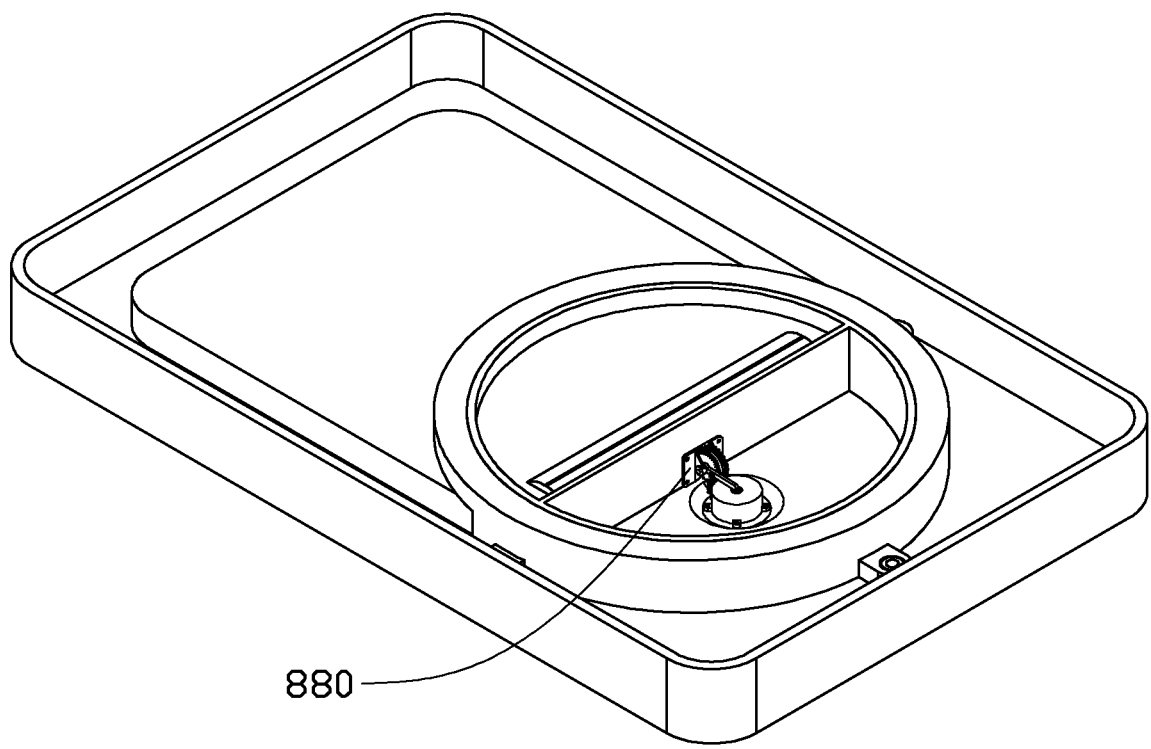
FIG. 7 is an isometric view of the electronic device of FIG. 2, showing the electronic device inverted.

Referring also to FIG. 7, two locking elements 880 are placed on a surface of the second sidewall 813 away from the pivot shafts 816. In the illustrated embodiment, each of the locking elements 880 is in the form of an L-shaped bracket having a base and a knuckle extending perpendicularly from the base. The base of each locking element 880 is fixed to the second sidewall 813, with the two locking elements 880 spaced from and symmetrically opposite to each other. Each locking element 880 defines a blind hole 881 (shown in FIG. 10). In the illustrated embodiment, the blind hole 881 is defined in the knuckle, with the blind holes 881 of the two locking elements 880 facing each other and aligned with each other.

Figure 4:
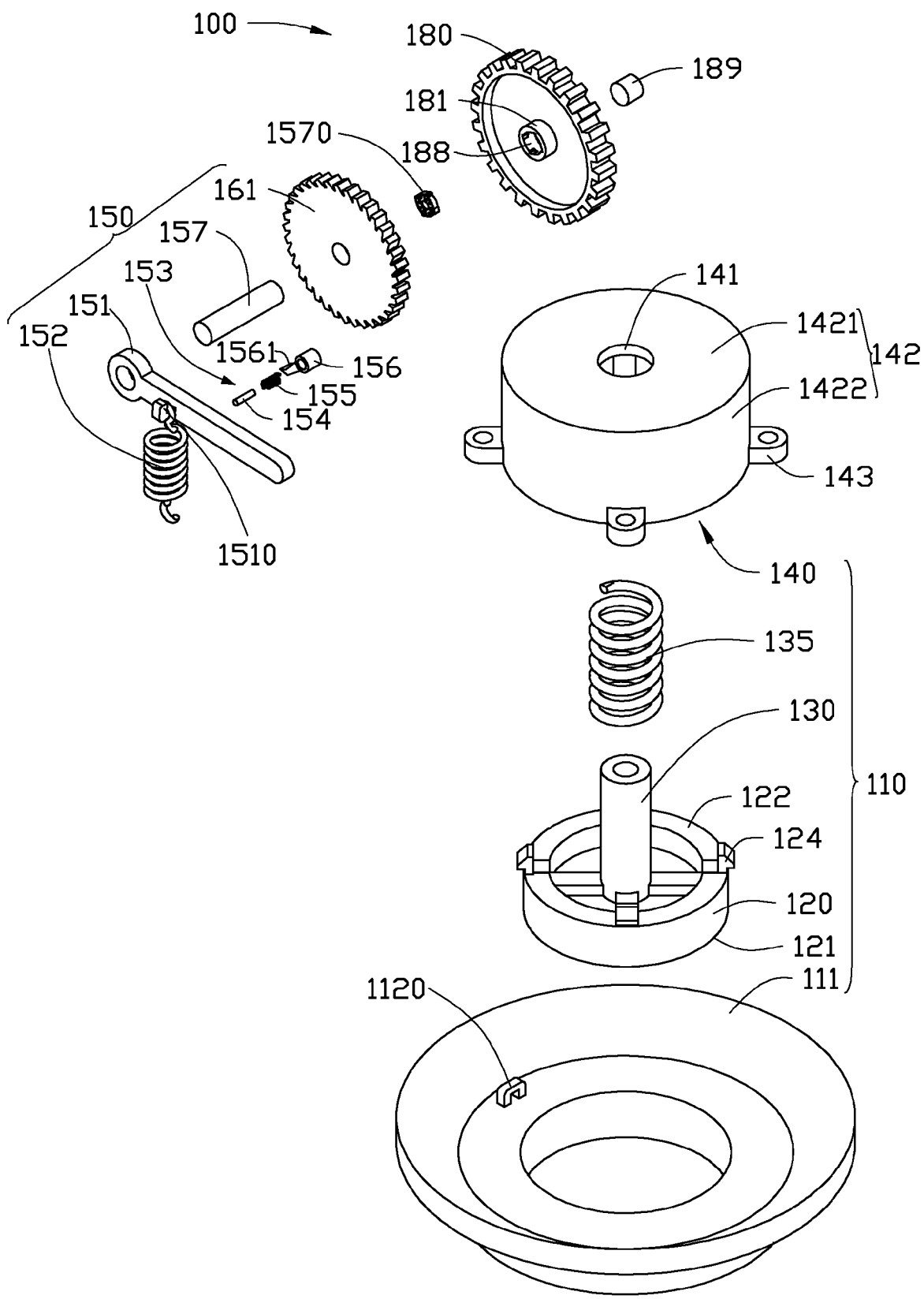
FIG. 4 is an enlarged, exploded view of the rotatable ejection mechanism of the electronic device of FIG. 1, showing the rotatable ejection mechanism inverted.
Figure 5:
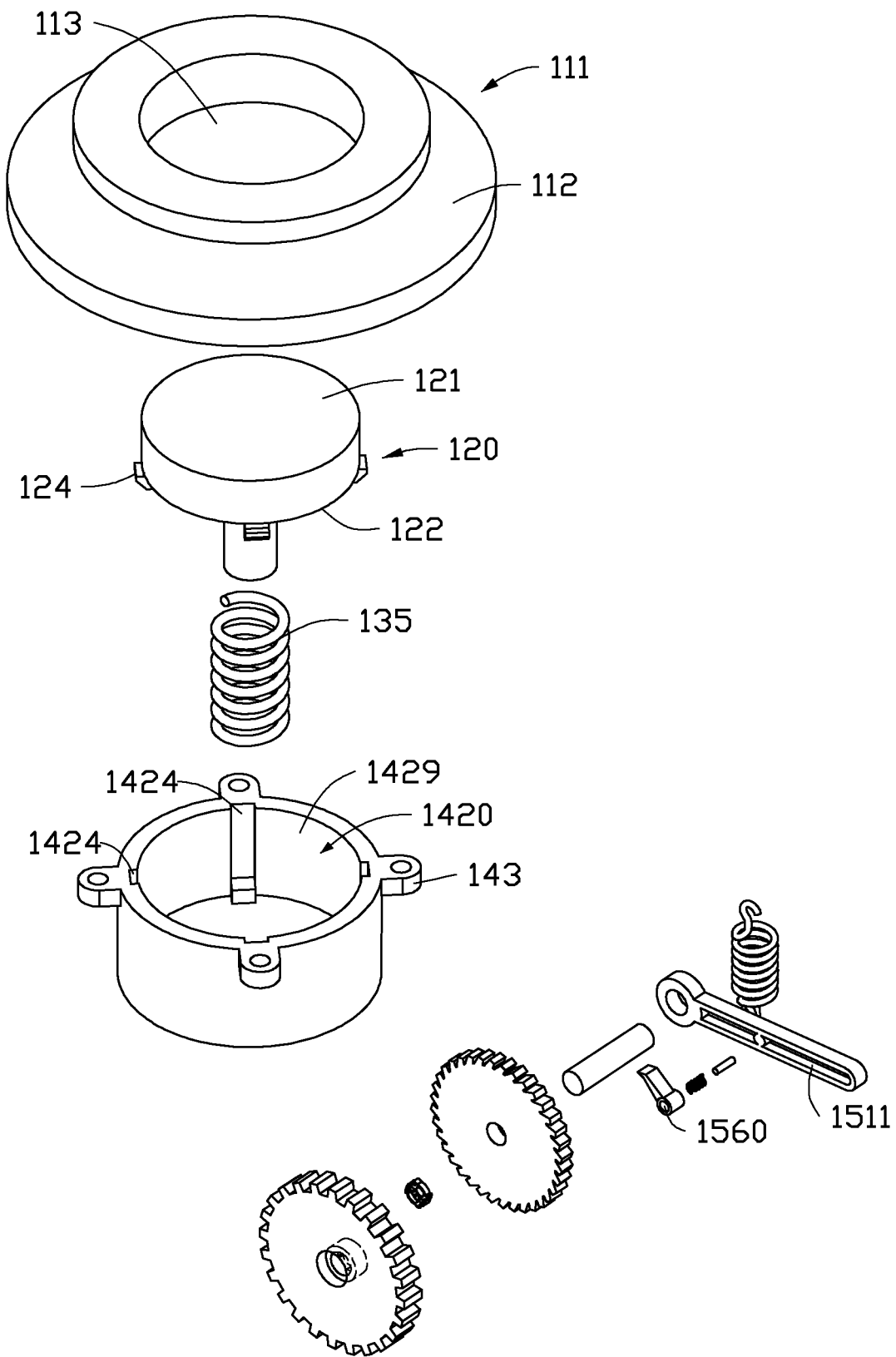
FIG. 5 is similar to FIG. 4, but showing the rotatable ejection mechanism right-side-up.
Figure 6:
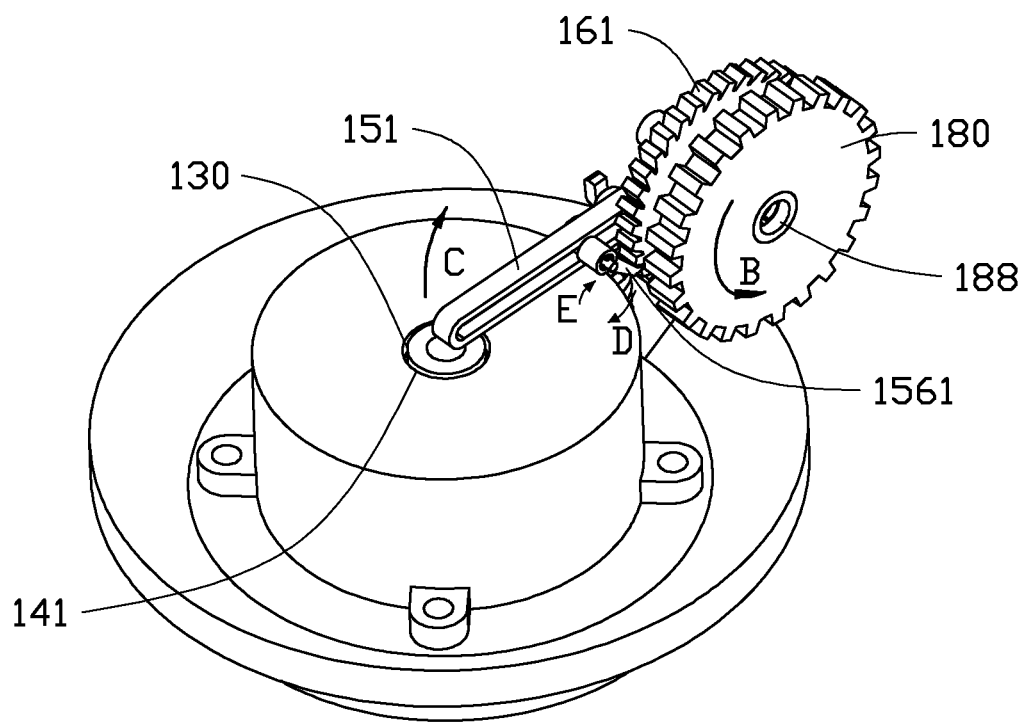
FIG. 6 is an assembled, isometric view of the rotatable ejection mechanism of FIG. 4.

Referring also to FIGS. 4-6, the ejection mechanism 100 includes a button module 110, a driving element 150, and a first gear 180 connected to the driving element 150. The teeth 190 of the display 700 are adjacent to the first through hole 818. An arraying direction of the teeth 190 is substantially perpendicular to a pivot axis A-A defined by the two pivot shafts 816. The first gear 180 is meshed with the teeth 190. The button module 110 controls the driving element 150 to move, the driving element 150 drives the first gear 180 to rotate, and the first gear 180 drives the teeth 190 to rotate, thereby driving the display 700 to rotate relative to the base 800.

The button module 110 includes a fixing element 111, a button 120, an arm 130 fixed to the button 120, an elastic element 135 placed over the arm 130, and a button housing 140 for receiving the button 120, the arm 130, and the elastic element 135.

The fixing element 111 is fixed in the first opening 819. The fixing element 111 includes a fixing plate 112. The fixing plate 112 defines a second through hole 113. The button 120 includes a pressing surface 121 and a back surface 122 at opposite sides thereof. The arm 130 is fixed to the back surface 122. Alternatively, the arm 130 can be integrally formed with the button 120 at the back surface 122. A number of sliding hooks 124 are set substantially uniformly around an edge of the button 120. In one embodiment, a size of the second through hole 113 is slightly larger than a size of the pressing surface 121.

The button housing 140 includes a body 142, and a number of ears 143 set around an edge of the body 142. The body 142 includes a bottom wall 1421, and a cylindrical sidewall 1422 extending up from a circumferential edge of the bottom wall 1421. The bottom wall 1421 defines a third through hole 141 for the arm 130 to pass through. The body 142 defines a housing opening 1429 opposite to the bottom wall 1421. The bottom wall 1421 cooperates with the sidewall 1422 to form a receiving space 1420 for receiving the button 120, the arm 130, and the elastic element 135. The ears 143 are fixed to the fixing plate 112 by a fixing method, such as screws, thereby fixing the button housing 140 to the base 800. The sidewall 1422 defines a number of sliding grooves 1424 in an inner periphery thereof. The sliding hooks 124 are insertable into the sliding grooves 1424 and are slidable along the sliding grooves 1424, thereby slidably connecting the button 120 to the button housing 140.

One end of the arm 130 away from the button 120 passes through the third through hole 141 to drive the driving element 150 to move when the button 120 is pressed. The elastic element 135 is placed over the arm 130. One end of the elastic element 135 resists the back surface 122, while another end of the elastic element 135 resists the bottom wall 1421 of the button housing 140. In one embodiment, the elastic element 135 is a coil spring.

Figure 9:
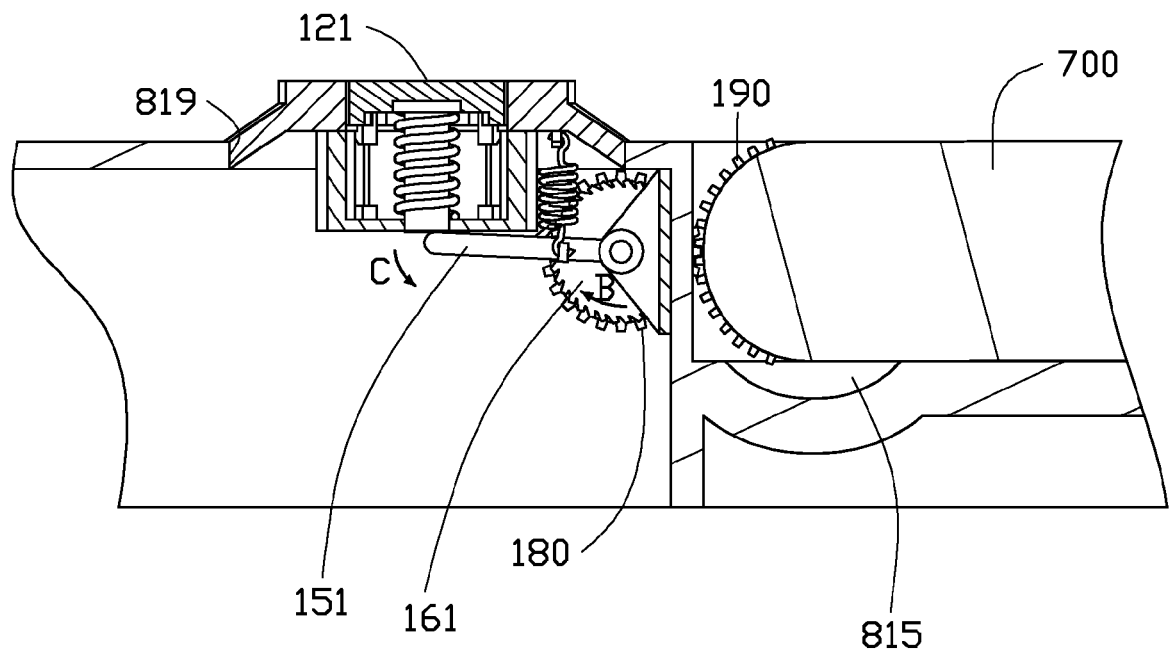
FIG. 9 is a cross-sectional view of the electronic device of FIG. 2, taken along the line IX-IX thereof.
Figure 10:
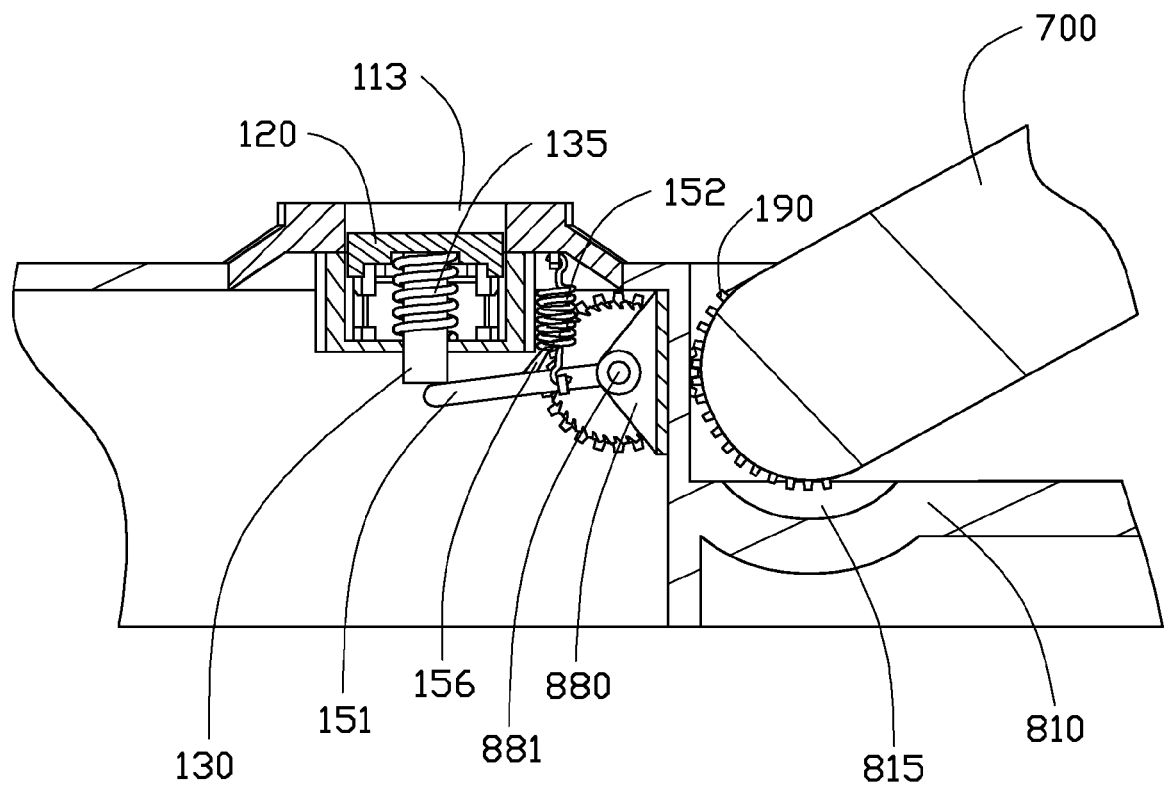
FIG. 10 is a cross-sectional view of the electronic device of FIG. 1, taken along the line X-X thereof.

Referring to FIGS. 6-7 and 9, when assembling the button module 110, the fixing element 111 is fixed in the first opening 819. The arm 130 is fixed to the button 120, and the elastic element 135 is placed over the arm 130. The arm 130 and the button 120 are received in the receiving space 1420, and the arm 130 is aligned with the third through hole 141. The sliding hooks 124 are slidably received in the sliding grooves 1424. The ears 143 are fixed to the fixing element 111. Therefore the button 120, the arm 130, and the elastic element 135 are received essentially between the fixing element 111 and the button housing 140.

The driving element 150 includes a driving pole 151, a retrieving element 152, a driving pin module 153, a shaft 157, and a second gear 161 fixed to the shaft 157. The driving pole 151 is rotatably connected to the shaft 157. The driving pole 151 includes a first hook 1510, and a slot 1511 defined along a length of the driving pole 151. The fixing plate 112 includes a second hook 1120 on an underside thereof. A bottom end of the retrieving element 152 is attached to the first hook 1510, and a top end of the retrieving element 152 is attached to the second hook 1120, thereby movably fixing the driving pole 151 to the fixing plate 112.

The driving pin module 153 is fixed to the driving pole 151, and includes a driving pin 156, a shaft body 154, and a second torsion spring 155. The driving pin 156 defines a fourth through hole 1560 therein, and has a protrusion 1561 extending from an outer circumference thereof. One end of the shaft body 154 is received and rigidly fixed in the slot 1511 of the driving pole 151. The second torsion spring 155 is placed over the shaft body 154, and the combination of part of the shaft body 154 and part of the second torsion spring 155 is received in the fourth through hole 1560. Thus, one end of the second torsion spring 155 abuts an inside surface of the slot 1511, while another end of the second torsion spring 155 abuts an inside surface of the fourth through hole 1560.

Figure 8:
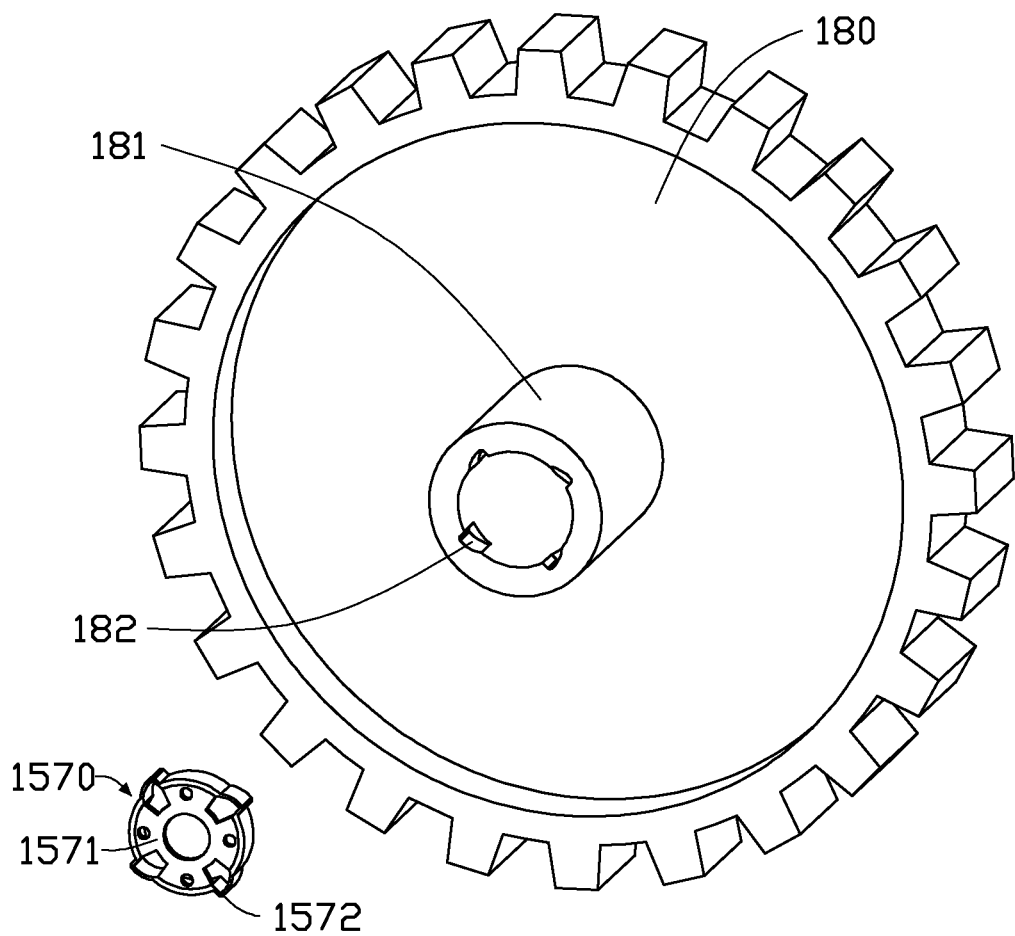
FIG. 8 is an enlarged view of a few elements of the rotatable ejection mechanism of FIG. 4.

Referring also to FIG. 8, one end of the shaft 157 adjacent to the first gear 180 includes a ratchet 1570. The ratchet 1570 is fixedly engaged with the first gear 180. In one embodiment, the ratchet 1570 is made of plastic. The ratchet 1570 includes a main body 1571, and a number of fangs 1572 extending from a circumferential edge of the main body 1571. The main body 1571 surrounds the end of the shaft 157 and is fixed to the end of the shaft 157.

The driving element 150 further includes a fixing shaft 189. The fixing shaft 189 is used to rotatably fix the first gear 180 to one of the locking elements 880. The first gear 180 includes a central collar 181 and a central hole 188. The central hole 188 extends through both a middle of the first gear 180 and a middle of the collar 181. The central hole 188 is used to rotatably receive the fixing shaft 189, and fixedly receive the ratchet 1570. In particular, the ratchet 1570 is received in the collar 181. The collar 181 defines a number of grooves 182 for receiving the fangs 1572 of the ratchet 1570.

When assembling the driving element 150, one end of the shaft 157 is fixed to the second gear 161. The end of the shaft 157 protrudes out from the second gear 161, so that the ratchet 1570 can be fixed on the end of the shaft 157. Then the end of the shaft 157 with the ratchet 1570 is received in the collar 181 of the first gear 180. A fulcrum end of the driving pole 151 is sleeved over another end of the shaft 157. One end of the fixing shaft 189 is received in the blind hole 881 of one of the locking elements 880, while another end of the fixing shaft 189 is received in the central hole 188 of the first gear 180. The other end of the shaft 157 is received in the blind hole 881 of the other locking element 880. One end of the shaft body 154 is received and rigidly fixed in the slot 1511 of the driving pole 151. The second torsion spring 155 is placed over the shaft body 154. The combination of part of the shaft body 154 and part of the second torsion spring 155 is received inside the fourth through hole 1560 of the driving pin 156. Thus, one end of the second torsion spring 155 abuts the inside surface of the slot 1511, while the other end of the second torsion spring 155 abuts the inside surface of the fourth through hole 1560.

A free end of the protrusion 1561 of the driving pin 156 is received between two teeth of the second gear 161. In one embodiment, the second gear 161 cooperates with the protrusion 1561 of the driving pin 156 to form a ratchet mechanism. That is, the second gear 161 can be driven to rotate by the protrusion 1561 of the driving pin 156, but the driving pin 156 can not be driven to rotate by the second gear 161. The driving pole 151 is movably fixed to the base 800 via the retrieving element 152, which is attached to the fixing element 111. In particular, the bottom end of the retrieving element 152 is engaged with the first hook 1510 of the driving pole 151, and the top end of the retrieving element 152 is engaged with the second hook 1120 of the fixing element 111. A free end of the driving pole 151 resists a bottom end of the arm 130.

Referring to FIGS. 6 and 8-10, when switching the display 700 from the first state to the second state, the button 120 is pressed by a user's finger until the display 700 has fully rotated from the first state up to the second state. In such process, the arm 130 protrudes down beyond the third through hole 141 to drive the driving pole 151 to rotate around the shaft 157 along a direction C. During the rotating of the driving pole 151, the elastic element 135 is compressed by the button 120, and the retrieving element 152 is stretched by the driving pole 151. In addition, because one end of the second torsion spring 155 abuts the inside surface of the slot 1511 of the driving pole 151, while the other end of the second torsion spring 155 abuts the inside surface of the fourth through hole 1560 of the driving pin 156, the second torsion spring 155 controls the driving pin 156 to rotate the shaft body 154 along a direction D when the driving pole 151 rotates around the shaft 157 along the direction C. Because the free end of the protrusion 1561 is received between two teeth of the second gear 161, the driving pin 156 drives the second gear 161 to rotate along a direction B. Because the second gear 161 is fixed to the shaft 157, the second gear 161 drives the shaft 157 to rotate along the direction B, and the shaft 157 drives the ratchet 1570 to rotate along the direction B. Because the fangs 1572 of the ratchet 1570 are engaged in the grooves 182 of the first gear 180, the ratchet 1570 drives the first gear 180 to rotate along the direction B. Thereby, the first gear 180 drives the teeth 190 on the bottom end of the display 700 to move, and so the display 700 rotates counterclockwise relative to the base 800 in order to form the inclined angle relative to the base 800.

Because the first torsion springs 817 are twisted and store elastic potential energy when the display 700 is in the first state received in the recessed portion 810, when the display 700 rotates up relative to the base 800, the first torsion springs 817 release their potential energy and cooperate with the first gear 180 and the teeth 190 to move the display 700 up to the inclined angle relative to the base 800.

After the display 700 has fully rotated up to the second state, the user releases his/her pressure applied on the button 120, and the button 120 automatically moves back up to its original position. This is because, during the above-described rotating process of the driving pole 151, the elastic element 135 is compressed by the button 120, and the retrieving element 152 is stretched by the driving pole 151; therefore the elastic element 135 rebounds to drive the button 120 to return to its original position, and the retrieving element 152 rebounds to drive the driving pole 151 to return to its original position. In the process of the driving pole 151 returning to its original position, the second torsion spring 155 controls the driving pin 156 to rotate along a direction E (opposite to the direction D). Because the second gear 161 cooperates with the protrusion 1561 of the driving pin 156 to form the ratchet mechanism, even though the driving pin 156 rotates along the direction E, the driving pin 156 does not drive the second gear 161 to rotate. That is, the second gear 161 remains in position, and correspondingly the display 700 remains in position in the second state.

When switching the display 700 from the second state to the first state, the display 700 is pressed by an external force to rotate clockwise until the display 700 is received in the recessed portion 810. During the rotation of the display 700, the teeth 190 drive the first gear 180 to rotate, the first gear 180 drives the ratchet 1570 to rotate, the ratchet 1570 drives the shaft 157 to rotate, and the shaft 157 drives the second gear 161 to rotate and return to an original position. As described above, because the second gear 161 cooperates with the protrusion 1561 of the driving pin 156 to form the ratchet mechanism, the second gear 161 does not drive the driving pin 156 to rotate when the second gear 161 rotates back to the original position of the second gear 161. Because the force of gravity acting on the display 700 is greater than the force corresponding to the elastic potential energy of the first torsion springs 817, the display 700 overcomes the resistance of the first torsion springs 817 and remains in the recessed portion 810.

Although the present disclosure has been specifically described on the basis of embodiments thereof, the disclosure is not to be construed as being limited thereto. Various changes or modifications may be made to the embodiments without departing from the scope and spirit of the disclosure.

What is claimed is:
1. An electronic device comprising:
a base defining a recessed portion;
a display received in the recessed portion, and pivotably connected to sidewalls of the recessed portion, a bottom end of the display having a plurality of teeth; and
a user-actuatable ejection mechanism positioned in the base, wherein the user-actuatable ejection mechanism drives the display to rotate up relative to the base when actuated by a user, wherein the ejection mechanism comprises a button module, a driving element and a first gear connected to the driving element and meshed with the teeth; the button module is pressable by a user to drive the driving element to move, whereupon the driving element drives the first gear to rotate, and the first gear drives the teeth to rotate, whereby the display rotates up relative to the base; the button module further comprises a fixing element, a button, and an arm fixed to the button; the button comprises a pressing surface and a back surface at opposite sides thereof, the base defines a first opening, the fixing element is fixed in the first opening, and comprises a fixing plate which defines a second through hole for exposing the pressing surface of the button, the arm being fixed to the back surface.

2. The electronic device as described in claim 1, further comprising two pivot shafts and two first torsion springs, wherein the recessed portion comprises a bottom, a first sidewall, a second sidewall, and a third sidewall opposite to the first sidewall, the two pivot shafts are respectively fixed to the first sidewall and the third sidewall, the two first torsion springs are respectively positioned over the two pivot shafts, an arraying direction of the teeth is substantially perpendicular to a pivot axis defined by the two pivot shafts, the display is pivotably connected to the first sidewall and the third sidewall by the two pivot shafts, one end of each first torsion spring abuts the bottom, and another end of each first torsion spring abuts the display; when the display is received in the recessed portion, the two first torsion springs are twisted to store elastic potential energy; and when the display is rotated up relative to the base, the energy in the first torsion springs is released to cooperate with the ejection mechanism to position the display at an inclined angle relative to the base.

3. The electronic device as described in claim 2, wherein the second sidewall defines a first through hole, and part of the first gear extends through the first through hole to be meshed with the teeth.

4. The electronic device as described in claim 2, wherein the button module further comprises an elastic element positioned over the arm, and a button housing fixed to the base, the button housing comprises a body and a plurality of ears set around an edge of the body, the body comprises a bottom wall and a cylindrical sidewall extending up from a circumferential edge of the bottom wall, the bottom wall defines a third through hole for the arm to pass through, the bottom wall cooperates with the cylindrical sidewall to form a receiving space for receiving the button, the arm and the elastic element, the ears are fixed to the fixing plate thereby fixing the button housing to the base, one end of the elastic element abuts the back surface, and another end of the elastic element abuts the bottom wall.

5. The electronic device as described in claim 4, wherein a plurality of sliding hooks are set substantially uniformly around an edge of the button, the cylindrical sidewall defines a plurality of sliding grooves matching the sliding hooks in an inner periphery thereof, and the sliding hooks are slidably received in the sliding grooves and are slidable along the sliding grooves, thereby slidably connecting the button to the button housing.

6. The electronic device as described in claim 4, wherein the driving element comprises a driving pole, a retrieving element, a shaft engaged with the first gear and rotatably connected to the driving pole, a second gear fixed to the shaft, and a driving pin module fixed to the driving pole and movably engaged with the second gear; the driving pole defines a slot along a length thereof, and comprises a first hook, the fixing plate comprises a second hook on an underside thereof, and a bottom end of the retrieving element is attached to the first hook and a top end of the retrieving element is attached to the second hook thereby movably fixing the driving pole to the fixing plate; and the driving pin module comprises a driving pin, a shaft body and a second torsion spring, one end of the shaft body is received and rigidly fixed in the slot of the driving pole, the driving pin defines a fourth through hole therein, the driving pin has a protrusion extending from an outer circumference thereof, the second torsion spring is positioned over the shaft body, the combination of part of the shaft body and part of the second torsion spring is received in the fourth through hole, a free end of the protrusion is received between two teeth of the second gear, one end of the second torsion spring abuts an inside surface of the slot, and another end of the second torsion spring abuts an inside surface of the fourth through hole.

7. The electronic device as described in claim 6, wherein the driving element further comprises a fixing shaft, one end of the shaft adjacent to the first gear comprises a ratchet fixedly engaged with the first gear, the ratchet comprises a main body, and a plurality of fangs extending from a circumferential edge of the main body, the main body is fixed to the end of the shaft, the first gear comprises a central collar and a central hole, the central hole extends through both a middle of the first gear and a middle of the central collar, and the central hole rotatably receives the fixing shaft and fixedly receives the ratchet, with the central collar defining a plurality of grooves engagingly receiving the fangs of the ratchet.

8. The electronic device as described in claim 2, wherein the bottom defines a receiving groove for receiving some of the teeth.

9. The electronic device as described in claim 7, further comprising two locking elements positioned on a surface of the second sidewall away from the pivot shafts, wherein each of the two locking elements defines a blind hole, the fixing shaft movably fixes the first gear to one of the two locking elements, one end of the fixing shaft is received in the central hole, and another end of the fixing shaft is received in the blind hole of one of the two locking elements, one end of the shaft away from the ratchet is received in the blind hole of the other locking element, and another end of the shaft is fixed to the second gear.

10. The electronic device as described in claim 9, wherein each of the locking elements is in the form of an L-shape.

11. The electronic device as described in claim 1, wherein the bottom end of the display is arc-shaped.

12. The electronic device as described in claim 4, wherein the elastic element is a coil spring.

\* \* \* \* \*